US012699144B2

(12) United States Patent
Yoon

(10) Patent No.: US 12,699,144 B2
(45) Date of Patent: Aug. 4, 2026

(54) APPARATUS AND METHOD FOR PREDICTING STATE OF BATTERY

(71) Applicant: LG Energy Solution, Ltd., Seoul (KR)

(72) Inventor: Ho Byung Yoon, Daejeon (KR)

(73) Assignee: LG ENERGY SOLUTION, LTD., Seoul (KR)

( * ) Notice: Subject to any disclaimer, the term of this patent is extended or adjusted under 35 U.S.C. 154(b) by 705 days.

(21) Appl. No.: 17/628,731

(22) PCT Filed: Jul. 24, 2020

(86) PCT No.: PCT/KR2020/009784
§ 371 (c)(1),
(2) Date: Jan. 20, 2022

(87) PCT Pub. No.: WO2021/020817
PCT Pub. Date: Feb. 4, 2021

(65) Prior Publication Data
US 2022/0260641 A1 Aug. 18, 2022

(30) Foreign Application Priority Data
Jul. 31, 2019 (KR) ........................ 10-2019-0093275

(51) Int. Cl.
| | |
|---|---|
| *G01R 31/388* | (2019.01) |
| *H01M 10/42* | (2006.01) |
| *H01M 10/48* | (2006.01) |

(52) U.S. Cl.
CPC ...... *G01R 31/388* (2019.01); *H01M 10/4257* (2013.01); *H01M 10/482* (2013.01);
(Continued)

(58) Field of Classification Search
CPC .................................................. G01R 31/388
See application file for complete search history.

(56) References Cited

U.S. PATENT DOCUMENTS

| | | | | |
|---|---|---|---|---|
| 9,056,556 B1* | 6/2015 | Hyde | ...................... | B60L 58/20 |
| 2007/0029974 A1* | 2/2007 | Uchida | .............. | G01R 31/3842 |
| | | | | 320/132 |

(Continued)

FOREIGN PATENT DOCUMENTS

| | | |
|---|---|---|
| CN | 101022178 A | 8/2007 |
| CN | 101093902 A | 12/2007 |

(Continued)

OTHER PUBLICATIONS

Office Action dated Jan. 4, 2023, issued in corresponding Japanese Patent Application No. 2022-500509.

(Continued)

*Primary Examiner* — Hyun D Park
(74) *Attorney, Agent, or Firm* — Morgan, Lewis & Bockius LLP

(57) ABSTRACT

An apparatus for predicting a state of a battery includes: a first communication unit configured to: receive data on the temperature, current, and voltage of a plurality of battery cells measured in a battery management system included in a battery pack; and receive, from a vehicle using a corresponding battery cell, first environmental information regarding an environment in which the vehicle is traveling; a second communication unit configured to receive, from outside the apparatus, experimental data on the state of the battery cell or the battery pack in various environments; and a battery state prediction unit configured to predict the state of a battery using the received data on the temperature, current, and voltage of each of the plurality of battery cells, the first environmental information, and the state environmental information, wherein the state of the battery includes: a battery cell charge state; and a battery cell degradation state.

15 Claims, 4 Drawing Sheets

(52) U.S. Cl.
CPC .............. *H01M 2010/4271* (2013.01); *H01M 2010/4278* (2013.01); *H01M 2220/20* (2013.01)

(56) References Cited

U.S. PATENT DOCUMENTS

| | | | |
|---|---|---|---|
| 2009/0040033 | A1 | 2/2009 | Uchida |
| 2011/0156644 | A1* | 6/2011 | Arai ...................... B60L 3/0046 |
| | | | 320/109 |
| 2013/0096858 | A1 | 4/2013 | Amano et al. |
| 2014/0167774 | A1 | 6/2014 | Yagura et al. |
| 2014/0354289 | A1 | 12/2014 | Kim et al. |
| 2015/0123595 | A1* | 5/2015 | Hussain .............. H02J 7/00712 |
| | | | 320/107 |
| 2015/0239365 | A1 | 8/2015 | Hyde et al. |
| 2016/0229411 | A1* | 8/2016 | Murata ................... B60L 58/12 |
| 2017/0144560 | A1 | 5/2017 | Park et al. |
| 2018/0066958 | A1 | 3/2018 | Choi et al. |
| 2019/0118655 | A1 | 4/2019 | Grimes et al. |
| 2020/0403417 | A1 | 12/2020 | Jung et al. |

FOREIGN PATENT DOCUMENTS

| | | |
|---|---|---|
| CN | 108736079 A | 11/2018 |
| CN | 109683092 A | 4/2019 |
| JP | 2007-055450 A | 3/2007 |
| JP | 4179330 B2 | 11/2008 |
| JP | 2009-296837 A | 12/2009 |
| JP | 2012-078251 A | 4/2012 |
| JP | 2012-135148 A | 7/2012 |
| JP | 5413087 B2 | 2/2014 |
| JP | 2014-131483 A | 7/2014 |
| JP | 2015-007616 A | 1/2015 |
| JP | 2015-031588 A | 2/2015 |
| JP | 2015-070722 A | 4/2015 |
| JP | 5852399 B2 | 2/2016 |
| JP | 2022-539800 A | 9/2022 |
| KR | 10-2014-0042306 A | 4/2014 |
| KR | 10-1449291 B1 | 10/2014 |
| KR | 10-1527136 B1 | 6/2015 |
| KR | 10-1716460 B1 | 3/2017 |
| KR | 10-2017-0060516 A | 6/2017 |
| KR | 10-2018-0069604 A | 6/2018 |
| KR | 10-1897339 B1 | 9/2018 |
| KR | 10-2019-0074123 A | 6/2019 |

OTHER PUBLICATIONS

International Search Report issued in corresponding International Patent Application No. PCT/KR2020/009784 dated Nov. 2, 2020.
Office Action dated May 25, 2023, issued in corresponding Chinese Patent Application No. 202080048763.7.
Extended European Search Report issued from the European Patent Office dated Jul. 25, 2022 in corresponding European Patent Application No. 20847019.5.
Office Action dated Aug. 27, 2024 issued in corresponding Japanese Patent Application No. 2023-195008. (Note: KR 10-2014-0042306 A, JP 2009-296837 A, US 2014/0354289 A1, CN 108736079 A, and KR 10-1527136 B1 cited in this JP Office Action are already of record.).

\* cited by examiner

108

200 FIRST COMMUNICATION UNIT

204 STATE PREDICTION UNIT

206 ALLOWABLE TRAVELING DISTANCE PREDICTION UNIT

208 FAST CHARGE PREDICTION UNIT

210 BATTERY CELL IGNITION PREDICTION UNIT

202 SECOND COMMUNICATION UNIT

212 CONTROL UNIT

211 STORAGE UNIT

APPARATUS AND METHOD FOR PREDICTING STATE OF BATTERY

CROSS-REFERENCE TO RELATED APPLICATIONS

This application claims the benefit of Korean Patent Application No. 10-2019-0093275, filed on Jul. 31, 2019, in the Korean Intellectual Property Office, the disclosure of which is incorporated herein in its entirety by reference.

TECHNICAL FIELD

The present invention relates to an apparatus and a method for predicting the state of a battery using not only battery information but also external environment information.

BACKGROUND ART

Recently, research and development for secondary batteries have been actively conducted. Here, a secondary battery is a battery which may be charged/discharged, and includes all of typical Ni/Cd batteries, Ni/MH batteries, and the like and recent lithium ion batteries. A lithium ion battery among secondary batteries has an advantage in that the energy density thereof is much higher than that of typical Ni/Cd batteries, Ni/MH batteries, and the like. Also, a lithium ion battery may be manufactured small and lightweight, and thus, is used as a power source of mobile devices. Such a lithium ion battery has attracted attention as a next genera- tion energy storage medium since the range of use thereof has been expanded to being a power source of electric vehicles.

A secondary battery is generally used as a battery pack including a battery module in which a plurality of battery cells are connected in series and/or in parallel. In addition, the state and operation of the battery pack are managed and controlled by a battery management system (hereinafter, also referred to as 'BMS').

Particularly, an electric vehicle BMS measures the volt- age, current, and temperature of a battery cell to estimate the current state of a battery (charge state, degree of degrada- tion, and output). However, even though a BMS estimates the state of a battery cell on the basis of current measurement values to calculate an allowable traveling distance and available output power, it is not possible to predict the state of a battery which changes according to a traveling envi- ronment in the future, and thus, it is difficult to accurately calculate information such as the allowable traveling dis- tance.

DISCLOSURE OF THE INVENTION

Technical Problem

An aspect of the present invention provides a method for more accurately predicting the state of a battery by using experimental data on battery information obtained from an experiment performed in the same environment as an exter- nal environment of an electric vehicle.

Technical Solution

According to an aspect of the present invention, an apparatus for predicting the state of a battery includes a first communication unit for receiving data on the temperature, current, and voltage of a plurality of battery cells measured in a battery management system included in a battery pack and receiving, from a vehicle using a corresponding battery cell, first environmental information on an environment in which the vehicle is traveling, a second communication unit for receiving, from the outside, experimental data on the state of the battery cell or the battery pack in various environments, and a battery state prediction unit for pre- dicting the state of a battery by using the received data on the temperature, current, and voltage of each of the plurality of battery cells, the first environmental information, and the state environmental information, wherein the state of the battery includes a battery cell charge state and a battery cell degradation state.

The apparatus for predicting the state of a battery accord- ing to an aspect of the present invention further includes an allowable traveling distance prediction unit for predicting a traveling distance of the vehicle on the basis of the battery cell charge state, a fast charge prediction unit for predicting a fast charge current and time of the battery pack including the battery cell on the basis of the battery cell degradation state, and a battery cell ignition prediction unit for predicting an ignition possibility of the battery cell by using cell ignition data included in the experimental data, wherein the first communication unit transmits, to the battery manage- ment system, at least one of result values predicted by the allowable traveling distance prediction unit, the fast charge prediction unit, or the battery cell ignition prediction unit.

In the apparatus for predicting the state of a battery according to an aspect of the present invention, each of the allowable traveling distance prediction unit, the fast charge prediction unit, and the battery cell ignition prediction unit may perform prediction in one cycle in which prediction is performed by a predetermined number of times at a first time interval, and further comprises a control unit for determining whether an amount of change in data representing the environment in which the vehicle is traveling is equal to or less than a predetermined first value during one cycle of prediction, wherein, when the amount of change in data representing the environment of the vehicle is equal to or less than the predetermined first value during one cycle of prediction, the result value of the allowable traveling dis- tance prediction unit, the fast charge prediction unit, and the battery cell ignition prediction unit is transmitted to the vehicle, and, when the amount of change in data represent- ing the environment of the vehicle is greater than the predetermined first value during one cycle of prediction, the allowable traveling distance prediction unit, the fast charge prediction unit, and the battery cell ignition prediction unit predict result values again under changed environmental conditions.

In the apparatus for predicting the state of a battery according to an aspect of the present invention, the one cycle may be set to equal to or less than 0.7 seconds, and the predetermined number of times may be determined on the basis of the one cycle.

The apparatus for predicting the state of a battery accord- ing to an aspect of the present invention may further include a control unit which, when the result value predicted by the allowable traveling distance prediction unit, the fast charge prediction unit, or the battery cell ignition prediction unit and transmitted by the first communication unit is out of a predetermined error range with respect to a predicted result value of an allowable traveling distance, a fast charge current and time, or a battery cell ignition possibility cal- culated by an algorithm of the vehicle, allows the first communication unit to receive, from the vehicle, corresponding error information and second environmental information of the vehicle, and determines that the algorithm of the vehicle is failed when the first environmental information and the second environmental information have the same value and then allows the first communication unit to transmit an algorithm error signal of the vehicle, and when first environmental measurement data and second environmental measurement data are not the same, allows the battery cell state prediction unit to predict the state of the battery cell again by using the second environmental measurement data.

In the apparatus for predicting the state of a battery according to an aspect of the present invention, the predetermined error range is 5%.

In the apparatus for predicting the state of a battery according to an aspect of the present invention, when the result value predicted by the allowable traveling distance prediction unit, the fast charge prediction unit, or the battery cell ignition prediction unit and transmitted by the first communication unit is not out of the predetermined error range with respect to a predicted result value of an allowable traveling distance, a fast charge current and time, Or a battery cell ignition possibility calculated by an algorithm of the vehicle, the result value predicted by the allowable traveling distance prediction unit, the fast charge prediction unit, or the battery cell ignition prediction unit is displayed on a display of the vehicle.

According to another aspect of the present invention, a method which is for predicting the state of a battery and is performed by an apparatus for predicting the state of a battery by using the temperature, current, and voltage of a battery cell and information on an environment in which a vehicle is traveling includes a first step of predicting the state of a battery cell by using the temperature, current, and voltage of the battery cell measured in a battery management system of a vehicle, information on an environment in which the vehicle is traveling, and experimental data, and a second step of predicting an allowable traveling distance of the vehicle and a fast charge current and time of the vehicle by using the predicted state of the battery cell, wherein the experimental data is on experimental results for the state of the battery cell under various environmental conditions.

In the method for predicting the state of a battery according to an embodiment of the present invention, the state of the battery includes a battery cell charge state and a batter cell degradation state, and the allowable traveling distance of the vehicle is predicted by using the battery cell charge state and the fast charge current and time of the vehicle is predicted by using the battery cell degradation state.

In the method for predicting the state of a battery according to an embodiment of the present invention, the experimental data further includes cell ignition data, and the second step further includes a step of predicting an ignition possibility of the battery cell by using the predicted state of the battery cell and the cell ignition data.

In the method for predicting the state of a battery according to an embodiment of the present invention, the second step may be performed in one cycle in which the second step is performed for a predetermined number of times at a first time interval and may further include a step of determining whether an amount of change in data representing an environment in which the vehicle is traveling is equal to or less than a predetermined first value while the second step is performed for the one cycle, when the amount of change in data representing the environment is equal to or less than the first value, the predicted allowable traveling distance and fast charge current and time and information on the ignition possibility of the battery cell are transmitted to the vehicle, and when the amount of change in data representing the environment is greater than the first value, the first step is performed again.

In the method for predicting the state of a battery according to an embodiment of the present invention, the one cycle may be set to equal to or less than 0.7 seconds, and the predetermined number of times may be determined on the basis of the one cycle.

In the method for predicting the state of a battery according to an embodiment of the present invention, when the difference between the predicted allowable traveling distance of the vehicle and fast charge current and time and the information on the ignition possibility of the battery cell and prediction result values of an allowable traveling distance, a fast charge current and time, or an ignition possibility of the battery cell calculated by an algorithm of the vehicle is out of a predetermined error range, the first step is performed again by receiving, from the vehicle, new information on the temperature, current, and voltage of the battery cell and on the environment in which the vehicle travels.

In the method for predicting the state of a battery according to an embodiment of the present invention, the predetermined error range is 5%.

Advantageous Effects

The present invention may achieve an effect of more accurately predicting the state of a battery by using experimental data on battery information obtained from an experiment performed in the same environment as an external environment of an electric vehicle.

BRIEF DESCRIPTION OF THE DRAWINGS

The following drawings attached to the specification illustrate preferred examples of the present invention by example, and serve to enable technical concepts of the present invention to be further understood together with detailed description of the invention given below, and therefore the present invention should not be interpreted only with matters in such drawings.

MODE FOR CARRYING OUT THE INVENTION

Figure 1:
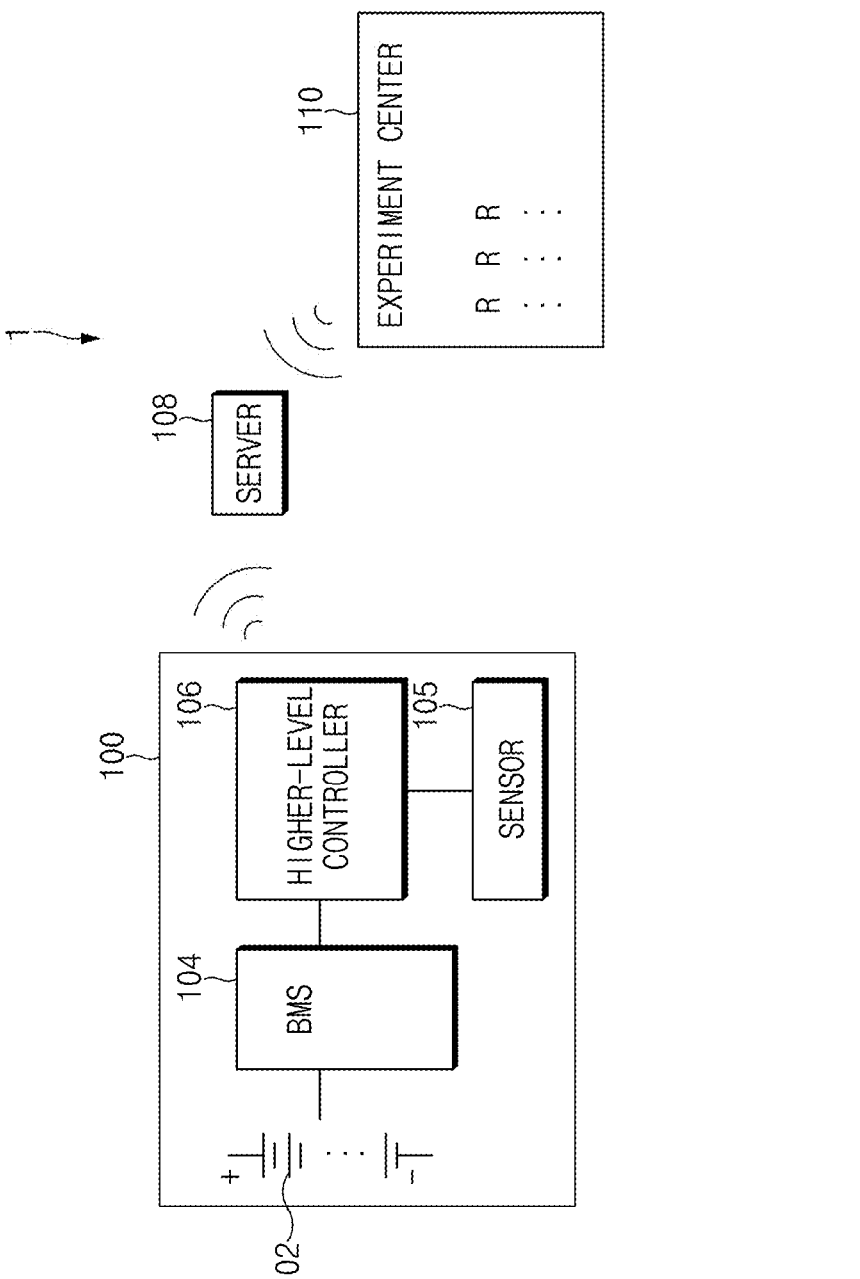
FIG. 1 illustrates a battery state prediction system according to an embodiment of the present invention.

Hereinafter, various embodiments of the present invention will be described in detail with reference to the accompanying drawings. In the present document, like reference numerals are used for like elements throughout the drawings, and redundant descriptors of the like elements are omitted.

For the various embodiments of the present invention disclosed in the present document, specific structural to functional descriptions are merely illustrative of the present invention. The various embodiments of the present invention may be embodied in various forms and should not be construed as limited to the embodiments set forth herein.

Terms such as "a first," "a second," "first," and "second" used in various embodiments may modify various components regardless of the order and/or importance thereof, and do not limited the corresponding components. For example, a first component may be referred to as a second component without departing from the scope of the present invention, and similarly, a second component may also be referred to as a first component.

The terms used in this document are only used to describe specific embodiments, and may not be intended to limit the scope of other embodiments. Singular expressions may include plural expressions unless the context clearly indicates otherwise.

All the terms used herein, including technical or scientific terms, may have the same meanings as those commonly understood by those skilled in the art of the present invention. Terms that are defined in a dictionary commonly used should be interpreted as having the same or similar meaning to the meaning in the context of the related art, and should not be interpreted as having an ideal or overly formal meaning unless explicitly defined in the present document. In some cases, even the terms defined in this document should not be interpreted as excluding embodiments of the present invention.

FIG. 1 illustrates a battery state prediction system 1 according to an embodiment of the present invention.

The battery state prediction system 1 may include a vehicle 100, a server which is a battery state prediction apparatus 108, and an experiment center 110.

The vehicle 100 includes a battery management system (BMS) 104 which monitors and controls a battery cell 102. The battery management system 104 measures the temperature, current, and voltage of the battery cell 102. The battery management system 104 transmits battery cell information including the temperature, current, and voltage of the battery cell 102 measured in real time to a higher-level controller 106.

In addition, the vehicle 100 has a sensor 105 capable of measuring various external environments. An external environment may include temperature, humidity, as well as road conditions. Also, information on an area in which the vehicle 100 is traveling using a GPS may be also included as an environmental element. In addition, the external environment may include all environmental elements of an environment in which the vehicle is traveling, and although not illustrated, a component capable of measuring all the environmental elements may also be included in the vehicle 100. A measurement value (environmental information) for an environmental element measured in real time is also transmitted to the controller 106.

The higher-level controller 106 transmits the information on the battery cell and the environmental information to the server 108.

Meanwhile, in the experiment center 110, experiments are performed under various environmental conditions (temperature, area, weather, traveling environment, and time) to transmit experimental data on the state of the battery cell under various environmental conditions to the server 108. The various environmental conditions may include, for example, high temperature and humid areas+summers, high temperature and humid areas+winters, desert areas+summers, desert areas+winters, highway environments, urban environments-traffic, urban environments-no traffic, and the like. In the experiment center 110, experiments are performed for the change in the state of the battery cell in each environment. In addition, the state of the battery cell under various environmental conditions in the experimental data includes an environment in which the battery cell may be subjected to ignition and cell ignition data which is data related to state data.

The server 108 receives the information, environmental information, and experimental data of the battery cell.

The server 108 may predict the state of the battery cell of the corresponding vehicle by using the received information, environmental information, and experimental data of the battery cell. The server 108 is a component for performing a function of a battery state prediction apparatus, and hereinafter, the 'server' and the 'battery state prediction apparatus' will be used interchangeably.

The state of the battery cell predicted by using the experimental data corresponding to the environmental information may be more accurate than the state of the battery cell predicted by using only the temperature, current, and voltage of a battery. This is because the battery is also affected by an environment in which a vehicle is traveling.

However, here, the server 108 may receive the environmental information from the vehicle, but instead of receiving the environmental information separately, may use a real-time amount of change in information of the battery cell received from the vehicle and the experimental data to predict the state of the battery cell by inferring information on an environment in which the vehicle is traveling.

The server 108 uses the charge state of the battery cell predicted from the state of the battery cell to predict an allowable traveling distance of the vehicle. In addition, the server 108 uses the degradation state of the battery cell predicted from the state of the battery cell to predict a fast charge current and time of the vehicle.

In addition, the server 108 uses the predicted state of the battery cell and the cell ignition data to predict an ignition possibility of the battery cell.

The server 108 stores result values for the predicted allowable traveling distance of the vehicle, the predicted fast charge current and time of the vehicle, and the predicted ignition possibility of the battery cell.

Also, the server 108 may use environmental information of the vehicle received in real time, the information on the battery cell, and the experimental data to predict the state of the battery and to predict result values for the allowable traveling distance of the vehicle, the fast charge current and time of the vehicle, and the ignition possibility of the battery cell. At this time, such a prediction is performed at a predetermined prediction cycle, and when the number of predictions becomes equal to or greater than a predetermined number of times (for example, 5 times), predicted information is transmitted to the vehicle. That is, the above operation is repeated in a cycle in which the prediction is repeatedly performed for a predetermined number of times in the above-described prediction cycle.

Here, the predetermined number of times is determined such that one cycle is within a predetermined time. For example, the predetermined time may be about 0.5 seconds to 0.7 seconds. The predetermined time may be determined in consideration of the time required for separating the battery from the system when there is a problem with the battery cell. For example, when there is a problem with the battery cell so that the battery is required to be separated from the system within one second, the predetermined number of times may be determined on the basis of the above-described prediction cycle, such that time required to repeat the prediction for the predetermined number of times is within 0.7 second (so that the battery may be electrically separated from the system in the remaining 0.3 seconds). The number of times and time described above are only exemplary for the description, and the present invention is not limited thereto. Those who are skilled in the art may understand that changes may be made according to various conditions, such as the specification of the system and the performance of the BMS 104.

In addition, the server 108 uses the environmental information of the vehicle received in real time to determine whether the environmental information has been changed. When the environmental information is changed in real time and the change rate thereof is equal to or greater than 20% in one cycle, the server 108 does not transmit, to the vehicle, the result values for the predicted allowable traveling distance of the vehicle, the predicted fast charge current and time of the vehicle, and the predicted ignition possibility of the battery cell. The server 108 use battery information and environmental information newly received from the vehicle and the experimental data received from the experiment center to predict the state of the battery cell. That is, the server begins a prediction cycle, again.

Meanwhile, as another embodiment of the present invention, the state of a battery cell predicted by a vehicle and the state of the battery cell predicted by a server may be compared to make a prediction on the state of the battery cell.

Specifically, the BMS 104 in the vehicle predict the state of a battery in a typical manner. Using the state of the battery predicted by the BMS 104, a traveling distance and a fast charge current and time of the vehicle is predicted and a cell ignition possibility is predicted. Thereafter, the BMS 104 receives from the server 108 in real time, the state of the battery cell, the allowable traveling distance, the fast charge current and time, and the cell ignition possibility predicted in the server 108, and compares the same with values predicted in the BMS 104. After the comparison, when the difference between the values predicted in the BMS 104 and the values predicted in the server 108 is within a predetermined range, the allowable traveling distance, fast charge current and time, cell ignition possibility, and the like received from the server 108 are displayed on a display in the vehicle.

After the comparison, when the difference between the values predicted in the BMS 104 and the values predicted in the server 108 is out of the predetermined range, whether the environment in which the vehicle is traveling is changed is determined. If there is no change, an algorithm for predicting the state of the battery of the vehicle is determined to have failed, and when an external environment of the vehicle is determined to have changed, environmental information of the vehicle and information on the battery cell measured again are transmitted to the server 108 to begin the prediction of the state of the battery cell again.

Figure 2:
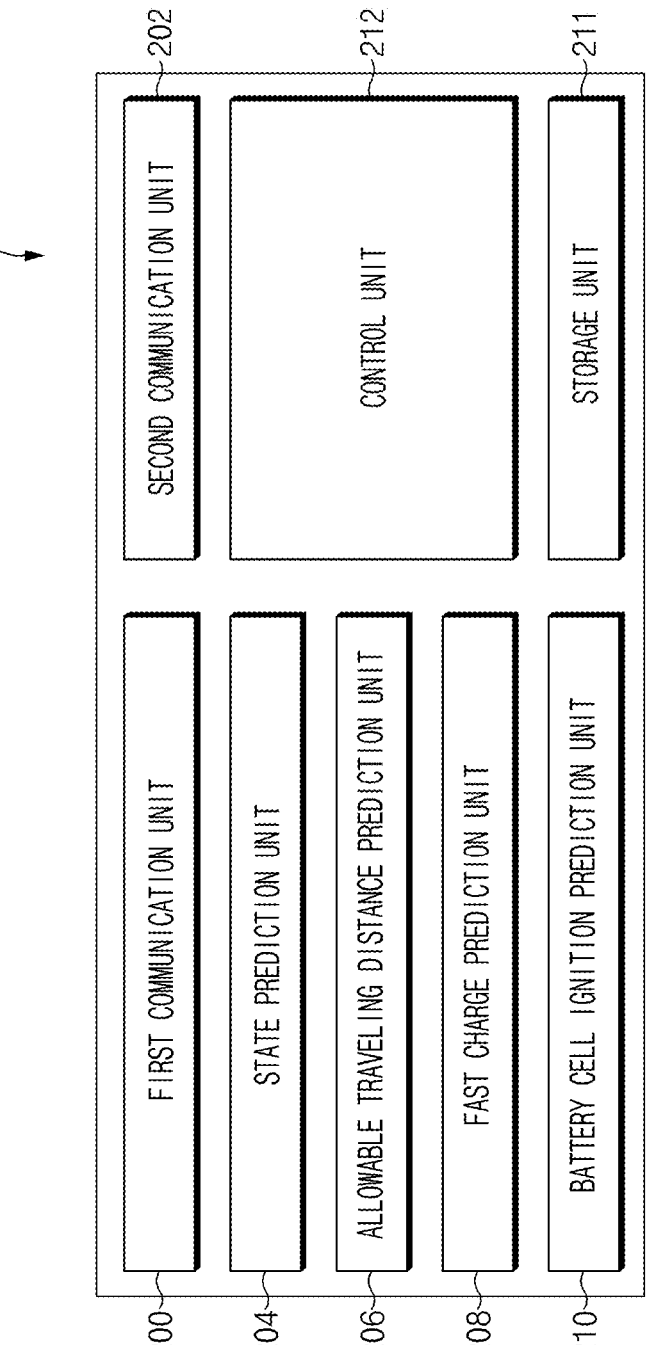
FIG. 2 is a configuration diagram of a battery state prediction apparatus according to an embodiment or another embodiment of the present invention.

FIG. 2 is a configuration diagram of a battery state prediction apparatus 108 according to an embodiment or another embodiment of the present invention.

The battery state prediction apparatus 108 (corresponding to the server in FIG. 1) includes a first communication unit 200, a second communication unit 202, a state prediction unit 204, an allowable traveling distance prediction unit 206, a fast charge prediction unit 208, a battery cell ignition prediction unit 210, a storage unit 211, and a control unit 212.

The first communication unit 200 receives measured battery cell information and environmental information from a vehicle.

The battery cell information includes current, temperature, and voltage values of a battery cell. In addition, the environmental information is information on the traveling environment of a vehicle, and may include information on temperature, area, weather, traveling environment, time, and the like.

The second communication unit 202 receives, from an experiment center, experimental data on the state of the battery cell under various environmental conditions which has been obtained by performing experiments the under various environmental conditions (temperature, area, weather, traveling environment, and time). The various environmental conditions may include, for example, high temperature and humid areas+summers, high temperature and humid areas+winters, desert areas+summers, desert areas+winters, highway environments, urban environments-traffic, urban environments-no traffic, and the like. In the experiment center 110, experiments are performed for the change in the state of the battery cell in each environment. In addition, the state of the battery cell under various environmental conditions in the experimental data includes an environment in which the battery cell may be subjected to ignition and cell ignition data which is data related to state data.

The first communication unit 200 and the second communication unit 202 are illustrated as separate components, but the present invention is not limited thereto. When the first communication unit 200 and the second communication unit 202 use the same communication protocol, the first communication unit 200 and the second communication unit 202 may communicate with the vehicle and the experiment center as one component.

The state prediction unit 204 may use the battery cell information and the environmental information received from the first communication unit 200 and the experimental data received from the second communication unit 202 to predict the state of a battery. At this time, the state prediction unit 204 may use experimental data which is the same or similar to the environmental information and battery information of the vehicle to predict the state of the battery of the corresponding vehicle. The state of the battery may include a battery cell charge state and a battery cell degradation state. The battery cell degradation state may be predicted through an internal resistance value.

The allowable traveling distance prediction unit 206 receives the battery cell charge state predicted in the state prediction unit 204. The allowable traveling distance prediction unit 206 uses the received battery cell charge state to predict an allowable traveling distance of the vehicle. Also, the allowable traveling distance prediction unit 206 may calculate the allowable traveling distance of the vehicle in consideration of not only the received battery cell charge state but also the received experimental data and the received environmental information of the vehicle.

The fast charge prediction unit 208 receives the battery cell degradation state predicted in the state prediction unit 204. The fast charge prediction unit 208 uses the received battery cell degradation state to calculate a fast charge current and time of the vehicle. In addition, the fast charge prediction unit 208 may calculate the fast charge current and time of the vehicle in further consideration of the received experimental data and the received environmental information of the vehicle.

The battery cell ignition prediction unit 210 uses the cell ignition data included in the experimental data, the environmental information received from the vehicle, and the battery cell information to predict an ignition possibility of the battery cell.

The storage unit 211 stores the predicted allowable traveling distance, fast charge current and time, and cell ignition possibility of the vehicle.

The controller 212 stores the predicted allowable traveling distance, fast charge current and time, and cell ignition possibility of the vehicle, and repeats the same in a cycle unit. For example, when one cycle is a period of time in which a prediction is made for a predetermined number of times, for example, 5 times, at a predetermined time interval (prediction cycle), the allowable traveling distance, fast charge current and time, and cell ignition possibility of a vehicle are predicted during one cycle. While the allowable traveling distance, fast charge current and time, and cell ignition possibility of the vehicle are being predicted during one cycle, it is determined whether environmental information of the vehicle at the beginning of the one cycle is changed to a predetermined range, for example, 20% or greater.

If the environmental information of the vehicle is changed only within the predetermined range during one cycle, the control unit 212 transmits, to the vehicle, information on the predicted allowable traveling distance, fast charge current and time, and cell ignition possibility of the vehicle.

On the other hand, if the environmental information of the vehicle is changed out of the predetermined range during one cycle, the control unit 212 uses battery information and environmental information newly received from the vehicle to predict the state of the battery cell.

Meanwhile, instead of receiving separate environmental information from the vehicle, the state prediction unit 204 may use an amount of change in the battery information received from the vehicle and the experimental data to infer the environmental information of the vehicle.

Meanwhile, the environmental change of the vehicle during one cycle may not be determined in the control unit 210, but may be determined in the vehicle.

Specifically, the first communication unit 200 transmits, to the vehicle, the information on the predicted state of the battery, allowable traveling distance, fast charge current and time, and cell ignition possibility.

If the error range of the state value of the battery cell predicted in the vehicle and the state value of the battery cell predicted in the battery state prediction apparatus is within a predetermined range, the vehicle displays information on the allowable traveling distance, fast charge current and time, and cell ignition possibility predicted in the battery state prediction apparatus on a display.

Figure 3:
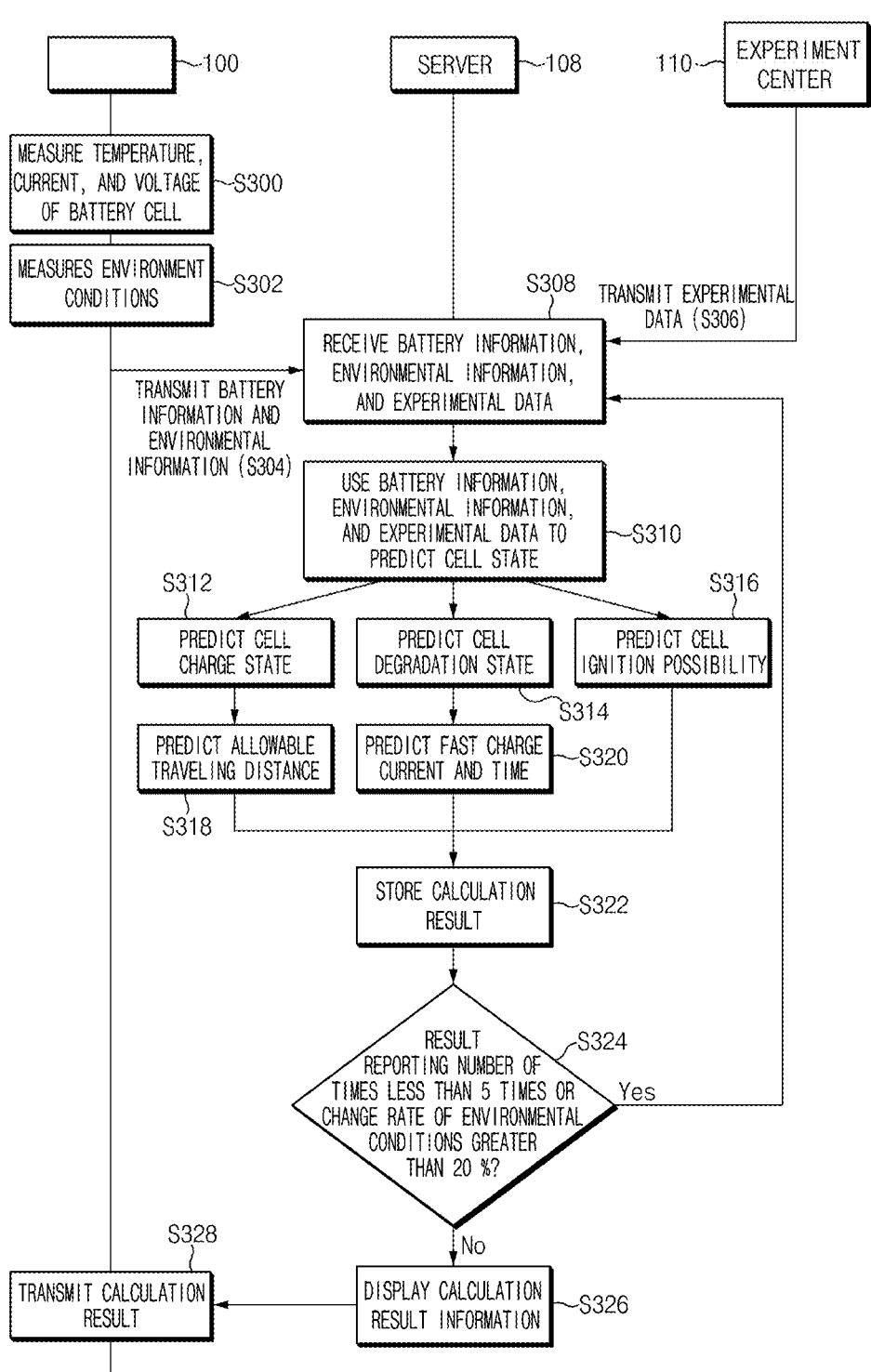
FIG. 3 is a flow chart of a battery state prediction method according to an embodiment of the present invention.

FIG. 3 is a flow chart of a battery state prediction method according to an embodiment of the present invention.

The vehicle 100 includes the battery management system 104 which monitors and controls the battery cell 102. The battery management system 104 measures the temperature, current, and voltage of the battery cell 102 S300. The battery management system 104 transmits battery cell information including the temperature, current, and voltage of the battery cell 102 measured in real time to a higher-level controller 106.

In addition, the vehicle 100 measures various external environments through various sensors mounted thereon S302. An external environment may include temperature, humidity, as well as road conditions. Also, information on an area traveled using a GPS of the vehicle 100 may also be included as an environmental element. In addition, the external environment may include all environmental elements of an environment in which the vehicle is traveling, and although not illustrated, a component capable of measuring all the environmental elements may also be included in the vehicle 100. A measurement value (environmental information) for an environmental element measured in real time is also transmitted to the controller 106.

The higher-level controller 106 transmits the information on the battery cell and the environmental information to the server 108 S304.

Meanwhile, in the experiment center 110, experiment are performed under various environmental conditions (temperature, area, weather, traveling environment, and time) to transmit experimental data on the state of the battery cell under various environmental conditions to the battery state prediction apparatus 108, which is a server S306.

In the battery state prediction apparatus 108, the first communication unit 200 receives the measured battery cell information and environmental information from the vehicle 100, and receives the experimental data from the experiment center 110 S308.

The state prediction unit 204 uses the battery cell information and the environmental information received from the first communication unit 200 and the experimental data received from the second communication unit 202 to predict the state of a battery S310.

At this time, the state prediction unit 204 may use experimental data which is the same or similar to the environmental information and battery information of the vehicle to predict the state of the battery of the corresponding vehicle. The state of the battery may include a battery cell charge state and a battery cell degradation state. The battery cell degradation state may be predicted through an internal resistance value. That is, when predicting the state of the battery cell, the state prediction unit 204 predicts the charge state of the corresponding battery cell S312, and predicts the degradation state of the corresponding battery cell S314.

The allowable traveling distance prediction unit 206 receives the battery cell charge state predicted in the state prediction unit 204. The allowable traveling distance prediction unit 206 uses the received battery cell charge state to predict an allowable traveling distance of the vehicle S318. Also, the allowable traveling distance prediction unit 206 may calculate the allowable traveling distance of the vehicle in consideration of not only the received battery cell charge state but also the received experimental data and the received environmental information of the vehicle.

The fast charge prediction unit 208 receives the battery cell degradation state predicted in the state prediction unit 204. The fast charge prediction unit 208 uses the received battery cell degradation state to calculate a fast charge current and time of the vehicle S320. In addition, the fast charge prediction unit 208 may calculate the fast charge current and time of the vehicle in further consideration of the received experimental data and the received environmental information of the vehicle.

The battery cell ignition prediction unit 210 uses the cell ignition data included in the experimental data, the environmental information received from the vehicle, and the battery cell information to predict an ignition possibility of the battery cell S316.

The storage unit 211 stores the predicted allowable traveling distance, fast charge current and time, and cell ignition possibility of the vehicle S322.

After the predicted allowable traveling distance, fast charge current and time, and cell ignition possibility of the vehicle are stored, the control unit 212 determines whether each predicted value has been measured during one cycle and whether environmental conditions of the vehicle have changed within a predetermined range during one cycle S324.

The controller 212 stores the predicted allowable traveling distance, fast charge current and time, and cell ignition possibility of the vehicle, and then measures each predicted value in a cycle unit. For example, when one cycle is a period of time in which a prediction is made for a predetermined number of times, for example, 5 times, at a predetermined time interval, the allowable traveling distance, fast charge current and time, and cell ignition possibility of a vehicle are predicted during one cycle. While the allowable traveling distance, fast charge current and time, and cell ignition possibility of the vehicle are being predicted during one cycle, it is determined whether environmental information of the vehicle at the beginning of the corresponding cycle is changed to a predetermined range, for example, 20% or greater S324.

If the environmental information of the vehicle is changed within the predetermined range during one cycle, the control unit 212 transmits, to the vehicle, information on the predicted allowable traveling distance, fast charge current and time, and cell ignition possibility of the vehicle S326.

On the other hand, if the environmental information of the vehicle is changed out of the predetermined range during one cycle, the control unit 212 performs a step of predicting the state of the battery cell using battery information and environmental information newly received from the vehicle S308 and S310.

The vehicle 100 displays information on the allowable traveling distance, fast charge current and time, and cell ignition possibility received from the battery state prediction apparatus 108 on a display S328.

Figure 4:
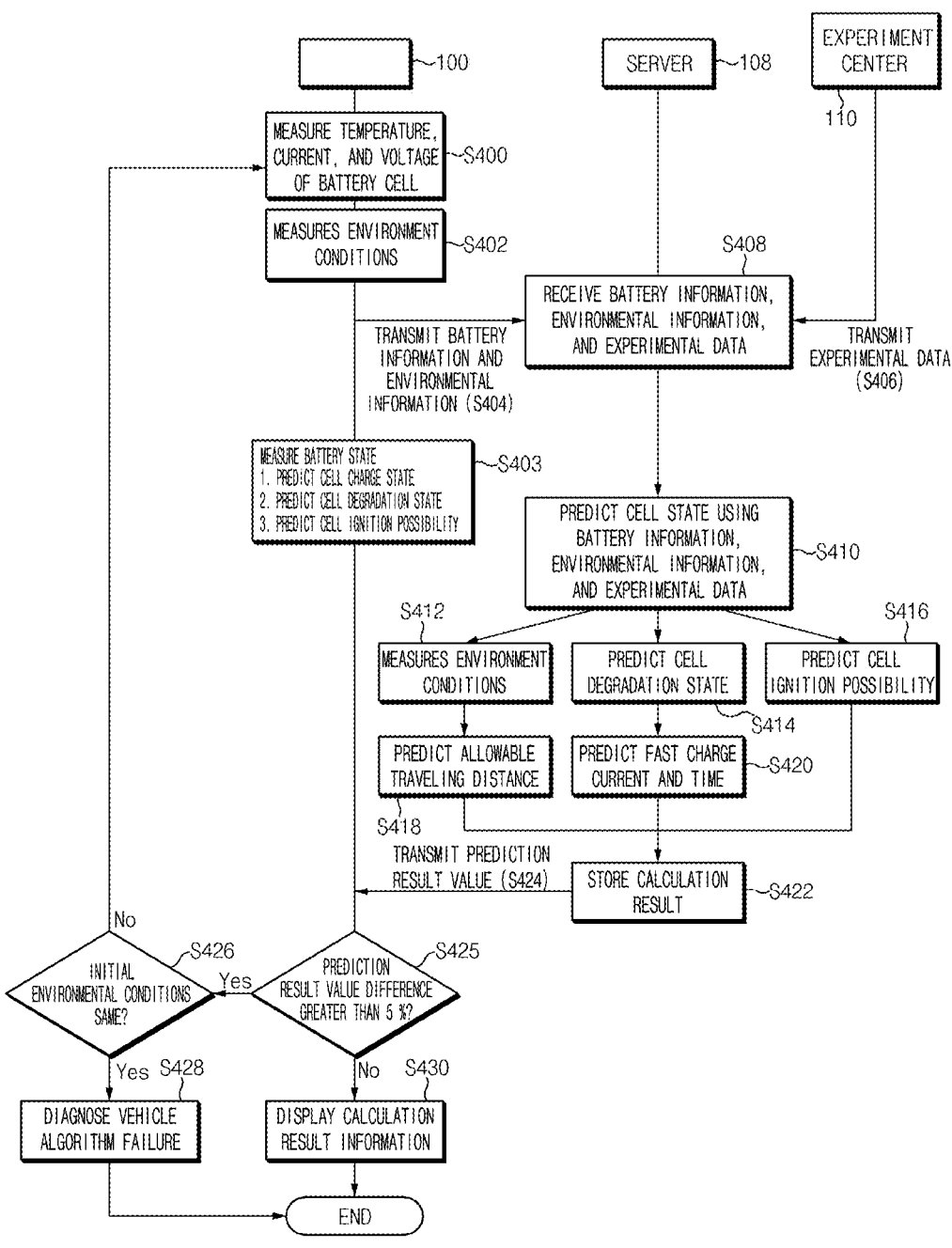
FIG. 4 is a flow chart of a battery state prediction method according to another embodiment of the present invention.

FIG. 4 is a flow chart of a battery state prediction method according to another embodiment of the present invention.

The vehicle 100 includes the battery management system 104 which monitors and controls the battery cell 102. The battery management system 104 measures the temperature, current, and voltage of the battery cell 102 S400. The battery management system 104 transmits battery cell information including the temperature, current, and voltage of the battery cell 102 measured in real time to a higher-level controller 106.

In addition, the vehicle 100 measures various external environments through various sensors mounted thereon S402. An external environment may include temperature, humidity, as well as road conditions. Also, information on an area traveled using a GPS of the vehicle 100 may also be included as an environmental element. In addition, the external environment may include all environmental elements of an environment in which the vehicle is traveling, and although not illustrated, a component capable of measuring all the environmental elements may also be included in the vehicle 100. A measurement value (environmental information) for an environmental element measured in real time is also transmitted to the controller 106.

The BMS of the vehicle 100 uses the received temperature, current, and voltage of the battery cell to estimate the state of a battery S403. Estimating the state of a battery cell in a vehicle may be easily derived by those skilled in the art, and thus, a detailed description thereof will be omitted.

The higher-level controller 106 transmits the information on the battery cell and the environmental information to the server 108 S404.

Meanwhile, in the experiment center 110, experiments are performed under various environmental conditions (temperature, area, weather, traveling environment, and time) to transmit experimental data on the state of the battery cell under various environmental conditions to the server 108 S406.

The first communication unit 200 of the battery state prediction apparatus 108 which is a server receives the measured battery cell information and environmental information from the vehicle 100, and receives the experimental data from the experiment center 110 S408.

The state prediction unit 204 uses the battery cell information and the environmental information received from the first communication unit 200 and the experimental data received from the second communication unit 202 to predict the state of a battery S410.

At this time, the state prediction unit 204 may use experimental data which is the same or similar to the environmental information and battery information of the vehicle to predict the state of the battery of the corresponding vehicle. The state of the battery may include a battery cell charge state and a battery cell degradation state. The battery cell degradation state may be predicted through an internal resistance value. That is, when predicting the state of the battery cell, the state prediction unit 204 predicts the charge state of the corresponding battery cell S412, and predicts the degradation state of the corresponding battery cell S414.

The allowable traveling distance prediction unit 206 receives the battery cell charge state predicted in the state prediction unit 204. The allowable traveling distance prediction unit 206 uses the received battery cell charge state to predict an allowable traveling distance of the vehicle S418. Also, the allowable traveling distance prediction unit 206 may calculate the allowable traveling distance of the vehicle in consideration of not only the received battery cell charge state but also the received experimental data and the received environmental information of the vehicle.

The fast charge prediction unit 208 receives the battery cell degradation state predicted in the state prediction unit 204. The fast charge prediction unit 208 uses the received battery cell degradation state to calculate a fast charge current and time of the vehicle S420. In addition, the fast charge prediction unit 208 may calculate the fast charge current and time of the vehicle in further consideration of the received experimental data and the received environmental information of the vehicle.

The battery cell ignition prediction unit 210 uses the cell ignition data included in the experimental data, the environmental information received from the vehicle, and the battery cell information to predict an ignition possibility of the battery cell S416.

The storage unit 211 stores the predicted allowable traveling distance, fast charge current and time, and cell ignition possibility of the vehicle S422.

The first communication unit 200 transmits information on the predicted allowable traveling distance, fast charge current and time, and cell ignition possibility to the vehicle S424.

The BMS 104 of the vehicle receives the predicted state of the battery cell, allowable traveling distance, fast charge current and time, and cell ignition possibility from the battery state prediction apparatus 108 in real time. The BMS 104 determines whether the difference between the state value of the battery cell received from the battery state prediction apparatus 108 and the state value of the battery cell predicted in the BMS 104 is within a predetermined range, for example, 5% S425.

After the comparison, when the difference between the value predicted in the BMS 104 and the value predicted in the battery state prediction apparatus 108 is within the predetermined range, the allowable traveling distance, fast charge current and time, cell ignition possibility, and the like received from the battery state prediction apparatus 108 are displayed on a display in the vehicle S430.

After the comparison, when the difference between the value predicted in the BMS 104 and the value predicted in the battery state prediction apparatus 108 is out of the predetermined range, whether the environment in which the vehicle is traveling is changed is determined S426.

If there is no change, an algorithm for predicting the state of the battery of the vehicle is determined to have failed S428, and when an external environment of the vehicle is determined to have changed, environmental information of the vehicle and information on the battery cell measured again are transmitted to the battery state prediction apparatus 108 to begin the prediction of the state of the battery cell again S400.

In the above, even if all the components constituting the embodiments of the present invention is described as being combined or combined to operate as one, the present invention is not necessarily limited to these embodiments. that is, if within the scope of the present invention, all of the components maybe selectively combined and operated as one or more.

In addition, the terms "include," "consist," or "have" as described above mean that a corresponding component may be intrinsic, unless specifically stated otherwise, and it should interpreted as including other components rather than excluding other components. All terms including technical or scientific terms have the same meanings as those commonly understood by those skilled in the art to which the present invention pertains, unless defined otherwise. Terms commonly used as those defined in a commonly used dictionary should be construed as being consistent with the context of the relevant art, and are not to be construed in an idealized or overly formal sense unless expressly defined in the present invention.

The above description is merely illustrative of the technical idea of the present invention, and those skilled in the art to which the present invention pertains may make various modifications and variations without departing from the essential characteristics of the present invention. Therefore, the embodiments disclosed in the present invention are not intended to limit the technical spirit of the present invention, but to explain, and the scope of the technical spirit of the present invention is not limited by these embodiments. The scope of protection of the present invention should be construed by the following claims, and all technical concepts within the scope of the present invention should be construed as being included within the scope of the rights of present invention.

The invention claimed is:

1. A server for predicting a state of a battery cell in a vehicle, comprising:
a first communicator configured to receive from the vehicle:
real-time battery data measured by a battery management system (BMS) in the vehicle, the real-time battery data including data on a temperature, current, and voltage of the battery cell measured by the BMS in the vehicle; and
real-time sensor data measured by at least one sensor of the vehicle, the real-time sensor data including first environmental information measured by the at least one sensor of the vehicle regarding an environment in which the vehicle is traveling;

a second communicator configured to receive, from outside the server, experimental data including cell ignition data regarding an experimental environment and a state of a given battery cell in which the given battery cell is subjected to ignition, the experimental data obtained from experiments performed outside the server for a change in a state of the given battery cell under various experimental environments including one or more of temperature, area, time, weather and traveling conditions; and
at least one processor configured to:
predict the state of the battery cell based on the data on the temperature, current, and voltage of the battery cell, the first environmental information, and the received experimental data;
predict an allowable traveling distance of the vehicle and a fast charge current and time of the battery cell based on the predicted state of the battery cell;
predict an ignition possibility of the battery cell based on the cell ignition data included in the received experimental data;
predict each of the allowable traveling distance of the vehicle, the fast charge current and time of the battery cell, and the ignition possibility of the battery cell a predetermined number of times in one cycle at a first time interval;
determine whether an amount of change in data representing the environment in which the vehicle is traveling is less than or equal to a predetermined first value during the one cycle of prediction;
if the amount of change in the data representing the environment of the vehicle is less than or equal to the predetermined first value during the one cycle of prediction, control the first communicator to transmit the predicted allowable traveling distance of the vehicle, the predicted fast charge current and time of the battery cell, and the predicted ignition possibility of the battery cell to the vehicle; and
if the amount of change in the data representing the environment of the vehicle is greater than the predetermined first value during the one cycle of prediction, predict again for another cycle the allowable traveling distance of the vehicle, the fast charge current and time of the battery cell, and the ignition possibility of the battery cell based on environmental information regarding a changed environment in which the vehicle is traveling.

2. The server of claim 1, wherein:
the one cycle is set to less than or equal to 0.7 seconds; and
the predetermined number of times is determined based on the one cycle.

3. The server of claim 1, wherein:
the predicted state of the battery cell comprises a battery cell degradation state;
the at least one processor is further configured to predict the fast charge current and time of the battery cell based on the battery cell degradation state; and
the battery cell degradation state is predicted through an internal resistance value.

4. A server for predicting a state of a battery cell in a vehicle, comprising:
a first communicator configured to receive from the vehicle:
real-time battery data measured by a battery management system (BMS) in the vehicle, the real-time battery data including data on a temperature, current, and voltage of the battery cell measured by the BMS in the vehicle; and real-time sensor data measured by at least one sensor of the vehicle, the real-time sensor data including first environmental information measured by the at least one sensor of the vehicle regarding an environment in which the vehicle is traveling;

a second communicator configured to receive, from outside the server, experimental data including cell ignition data regarding an experimental environment and a state of a given battery cell in which the given battery cell is subjected to ignition, the experimental data obtained from experiments performed outside the server for a change in a state of the given battery cell under various experimental environments including one or more of temperature, area, time, weather and traveling conditions; and at least one processor configured to:

predict the state of the battery cell based on the data on the temperature, current, and voltage of the battery cell, the first environmental information, and the received experimental data;

predict an allowable traveling distance of the vehicle and a fast charge current and time of the battery cell based on the predicted state of the battery cell;

predict an ignition possibility of the battery cell based on the cell ignition data included in the received experimental data;

if any of the allowable traveling distance of the vehicle, the fast charge current and time of the battery cell, and the ignition possibility of the battery cell predicted by the at least one processor is out of a predetermined error range with respect to a corresponding one of an allowable traveling distance, a fast charge current and time, and an ignition possibility of the battery cell calculated by an algorithm of the vehicle, control the first communicator to receive, from the vehicle, corresponding error information and second environmental information regarding a new environment in which the vehicle is traveling; and if the first environmental information and the second environmental information have the same value, determine that the algorithm of the vehicle failed and control the first communicator to transmit an algorithm error signal of the vehicle; and if the first environmental information and the second environmental information are not the same, predict the state of the battery cell again based on the second environmental information.

5. The server of claim 4, wherein the first communicator is further configured to transmit, to the BMS of the vehicle, at least one of the allowable traveling distance of the vehicle, the fast charge current and time of the battery cell, and the ignition possibility of the battery cell predicted by the at least one processor.

6. The server of claim 4, wherein the predetermined error range is 5%.

7. The server of claim 4, wherein, if one of the allowable traveling distance of the vehicle, the fast charge current and time of the battery cell, and the ignition possibility of the battery cell predicted by the at least one processor is within the predetermined error range with respect to the corresponding one of the allowable traveling distance, the fast charge current and time, and the ignition possibility of the battery cell calculated by the algorithm of the vehicle, the one of the allowable traveling distance of the vehicle, the fast charge current and time of the battery cell, and the ignition possibility of the battery cell predicted by the at least one processor is displayed on a display of the vehicle.

8. The server of claim 4, wherein:

the predicted state of the battery cell comprises a battery cell charge state and a battery cell degradation state; and the at least one processor is further configured to:

predict the allowable traveling distance of the vehicle based on the battery cell charge state; and predict the fast charge current and time of the battery cell based on the battery cell degradation state.

9. The server of claim 4, wherein:

the at least one processor is further configured to predict each of the allowable traveling distance of the vehicle, the fast charge current and time of the battery cell, and the ignition possibility of the battery cell a predetermined number of times in one cycle at a first time interval;

the one cycle is set to less than or equal to 0.7 seconds; and the predetermined number of times is determined based on the one cycle.

10. A method for predicting a state of a battery cell in a vehicle, the method comprising:

receiving from the vehicle, via a first communicator in a server:

real-time battery data measured by a battery management system (BMS) in the vehicle, the real-time battery data including data on a temperature, current, and voltage of the battery cell measured by the BMS in the vehicle; and real-time sensor data measured by at least one sensor of the vehicle, the real-time sensor data including first environmental information measured by the at least one sensor of the vehicle regarding an environment in which the vehicle is traveling;

receiving, from a source that is outside the vehicle and outside the server, via a second communicator in the server, experimental data including cell ignition data regarding an experimental environment and a state of a given battery cell in which the given battery cell is subjected to ignition, the experimental data obtained from experiments performed outside the vehicle and outside the server for a change in a state of the given battery cell under various experimental environments including one or more of temperature, area, time, weather and traveling conditions;

predicting, with at least one processor in the server, the state of the battery cell based on the data on the temperature, current, and voltage of the battery cell, the first environmental information, and the received experimental data;

predicting, with the at least one processor, an allowable traveling distance of the vehicle and a fast charge current and time of the battery cell based on the predicted state of the battery cell;

predicting, with the at least one processor, an ignition possibility of the battery cell based on the cell ignition data included in the received experimental data;

determining that any of the allowable traveling distance of the vehicle, the fast charge current and time of the battery cell, and the ignition possibility of the battery cell predicted by the at least one processor is out of a predetermined error range with respect to a corresponding one of an allowable traveling distance, a fast charge current and time, and an ignition possibility of the battery cell calculated by an algorithm of the vehicle;

in response to the determining, controlling, with the at least one processor, the first communicator to receive, from the vehicle, second environmental information regarding a new environment in which the vehicle is traveling;

determining, in a first comparison, that if the first environmental information and the second environmental information have the a same value, and, in response, determining, with the at least one processor, that the algorithm of the vehicle failed and controlling the first communicator to transmit an algorithm error signal of the vehicle; and determining, in a second comparison, that if the first environmental information and the second environmental information are not the same, and, in response, predicting, with the at least one processor, the state of the battery cell again based on the second environmental information.

11. The method of claim 10, wherein:

the predicted state of the battery cell comprises a battery cell charge state and a battery cell degradation state; and the predicting of the allowable traveling distance and the fast charge current and time includes:

predicting the allowable traveling distance of the vehicle based on the battery cell charge state; and predicting the fast charge current and time of the battery cell based on the battery cell degradation state.

12. The method of claim 10, wherein:

the predicting of the allowable traveling distance of the vehicle, the fast charge current and time of the battery cell, and the ignition possibility of the battery cell respectively includes predicting the allowable traveling distance of the vehicle, the fast charge current and time of the battery cell, and the ignition possibility of the battery cell a predetermined number of times in one cycle at a first time interval;

the one cycle is set to less than or equal to 0.7 seconds; and the predetermined number of times is determined based on the one cycle.

13. The method of claim 10, wherein the predetermined error range is 5%.

14. The method of claim 10, further comprising:

if one of the predicted allowable traveling distance of the vehicle, the predicted fast charge current and time of the battery cell, and the predicted ignition possibility of the battery cell is within the predetermined error range with respect to the corresponding one of the allowable traveling distance, a the fast charge current and time, and the ignition possibility of the battery cell calculated by the algorithm of the vehicle, displaying the one of the predicted allowable traveling distance of the vehicle, the predicted fast charge current and time of the battery cell, and the predicted ignition possibility of the battery cell on a display of the vehicle.

15. The method of claim 10, wherein the state of the given battery cell includes a battery cell degradation state of the given battery cell in which the given battery cell is subjected to ignition.

* * * * *